(12) United States Patent
Howell et al.

(10) Patent No.: US 8,367,942 B2
(45) Date of Patent: Feb. 5, 2013

(54) LOW PROFILE ELECTRICAL INTERPOSER OF WOVEN STRUCTURE AND METHOD OF MAKING SAME

(75) Inventors: David Gregory Howell, Chandler, AZ (US); Hao-Yun Ma, Chandler, AZ (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 511 days.

(21) Appl. No.: 12/589,719

(22) Filed: Oct. 27, 2009

(65) Prior Publication Data

US 2011/0094785 A1    Apr. 28, 2011

(51) Int. Cl.
*H05K 1/11* (2006.01)
(52) U.S. Cl. .................. 174/261; 174/260; 174/117 M; 442/110; 442/117
(58) Field of Classification Search .................. 174/255, 174/260, 261, 117 M; 442/110, 117
See application file for complete search history.

(56) References Cited

U.S. PATENT DOCUMENTS

| | | | | |
|---|---|---|---|---|
| 3,371,250 A | * | 2/1968 | Ross et al. | 361/809 |
| 5,163,837 A | * | 11/1992 | Rowlette, Sr. | 439/91 |
| 6,222,126 B1 | * | 4/2001 | Strange et al. | 174/70 R |
| 6,325,655 B1 | | 12/2001 | Noda et al. | |
| 6,674,008 B2 | * | 1/2004 | Nakamura | 174/98 |
| 6,852,395 B2 | * | 2/2005 | Dhawan et al. | 428/196 |
| 7,001,197 B2 | | 2/2006 | Shirai et al. | |
| 7,057,295 B2 | | 6/2006 | Ju | |
| 7,201,583 B2 | * | 4/2007 | Boggs et al. | 439/66 |
| 2010/0065320 A1 | * | 3/2010 | Urano | 174/261 |

FOREIGN PATENT DOCUMENTS

JP         2004006719 A  *  1/2004

\* cited by examiner

*Primary Examiner* — Angel R Estrada
*Assistant Examiner* — Dimary Lopez
(74) *Attorney, Agent, or Firm* — Wei Te Chung; Ming Chieh Chang

(57) ABSTRACT

An electrical interposer for connecting two electronic devices includes a plurality of first cores with undulating structure extending in a first direction and a plurality of second cores with undulating structure extending in a second direction angular with the first direction. Each first core has first peaks and first valleys alternately arranged in the first direction and each first peak is electrically connected with a corresponding neighboring first valley but insulated from others. Each second core has second peaks and second valleys alternately arranged in the second direction and each second peak is electrically connected with a corresponding neighboring second valley but insulated from others. The first cores and the second cores interlace with each other to reach a woven structure with the first peaks and the second peaks jointly constituting an upper interface, and the first valleys and the second valleys jointly constituting a lower interface.

12 Claims, 6 Drawing Sheets

LOW PROFILE ELECTRICAL INTERPOSER OF WOVEN STRUCTURE AND METHOD OF MAKING SAME

BACKGROUND OF THE INVENTION

1. Field of the Invention

The present invention relates to an electrical interposer, and more particularly to an interposer featured with woven structure and arranged between an IC package and a motherboard.

2. Description of Related Art

Various electrical connectors are widely used in a computer system for interconnecting two electronic devices, such as a PCB (Printed Circuit Board) and an IC (Integrated Circuit) package. These connectors each serve as a carrier for the IC package and also establishes electrical connection between the two devices.

U.S. Pat. No. 7,001,197 issued to Shirai on Feb. 21, 2006 unveils a typical electrical connector, in which an LGA (Land Grid Array) IC package is received. This electrical connector includes an insulative housing with a plurality of contacts disposed therein and a loading arrangement associated with the housing so as to retain the IC package. The LGA type of IC package has a plurality of flat conductive pads corresponding to the contacts in the electrical connector. The loading arrangement consists of substantially a loading cover, a loading lever and a frame surrounding the housing and supporting the loading cover and the loading lever.

Another type of electrical connector is disclosed by U.S. Pat. No. 6,325,655 issued to Noda on Dec. 4, 2001, which is used for connecting a PGA (Pin Grid Array) IC package. This type of electrical connector includes a base with a plurality of terminals therein, a cover mounted upon the base and movable relative to the base in a transversal direction, and an actuating lever mounted within the base and cover and characterized with a cam for driving the cover. The PGA IC package has a plurality of pin legs passing through corresponding holes arranged in the cover and then contacting with the terminals in the base so that the IC package is carried.

However, either Shirai or Noda has a significantly high profile, thereby occupying a relative larger space when positioned on a PCB. As the requirement for miniaturization of the electronic product grows, these high profile connectors are not competitive. In addition, these conventional connectors usually employ lots of components made of plastic or metal and thus result high cost, as well as difficulties of manufacturing.

U.S. Pat. No. 7,057,295 issued to Ju on Jun. 6, 2006 discloses a low profile interconnecting system, in which the IC package is equipped with a plurality of elastic terminals at the bottom position thereof. And the IC package is directly mounted on a PCB without a connector disposed therebetween. The terminals of the IC package respectively contact corresponding pads exposed on the PCB so as to establish electrical connection between the IC package and the PCB. Because there is no connector needed, the overall height of the system is reduced. However, there is no supporting arrangement provided for the terminals of the IC package, such as a conventional insulative housing. As a result, those contact terminals are vulnerable of collapsing when the IC package is in contact with the PCB. In addition, the process of mounting elastic terminals to the IC package is complicated and is not economic.

In view of the above, a new low profile electrical interposer is needed.

SUMMARY OF THE INVENTION

Accordingly, an object of the present invention is to provide an improved low profile electrical interposer and the method of making same.

According to one aspect of the present invention, there is provided an electrical interposer for connecting two electronic devices, which includes a plurality of first cores with undulating structure extending in a first direction and a plurality of second cores with undulating structure extending in a second direction angular with the first direction. Each first core has first peaks and first valleys alternately arranged in the first direction and each first peak is electrically connected with a corresponding neighboring first valley but insulated from others. Each second core has second peaks and second valleys alternately arranged in the second direction and each second peak is electrically connected with a corresponding neighboring second valley but insulated from others. The first cores and the second cores interlace with each other to reach a woven structure with the first peaks and the second peaks jointly constituting an upper interface, and the first valleys and the second valleys jointly constituting a lower interface.

According to another aspect of the present invention, there is provided a method of making an electrical interposer, which includes the steps of: providing a plurality of cores having identical undulating structure, each cores consisting of a plurality of peaks and valleys; plating the whole surface of each core to have conductive layers thereon; removing selected conductive layer on each core where insulation is desired so that one peak is electrically connected with a neighboring valley but insulative from others; and weaving the cores to form a fabric in which the peaks are arranged in an array for contacting with one electronic device and the valleys are arranged in another array for contacting with another electronic device.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
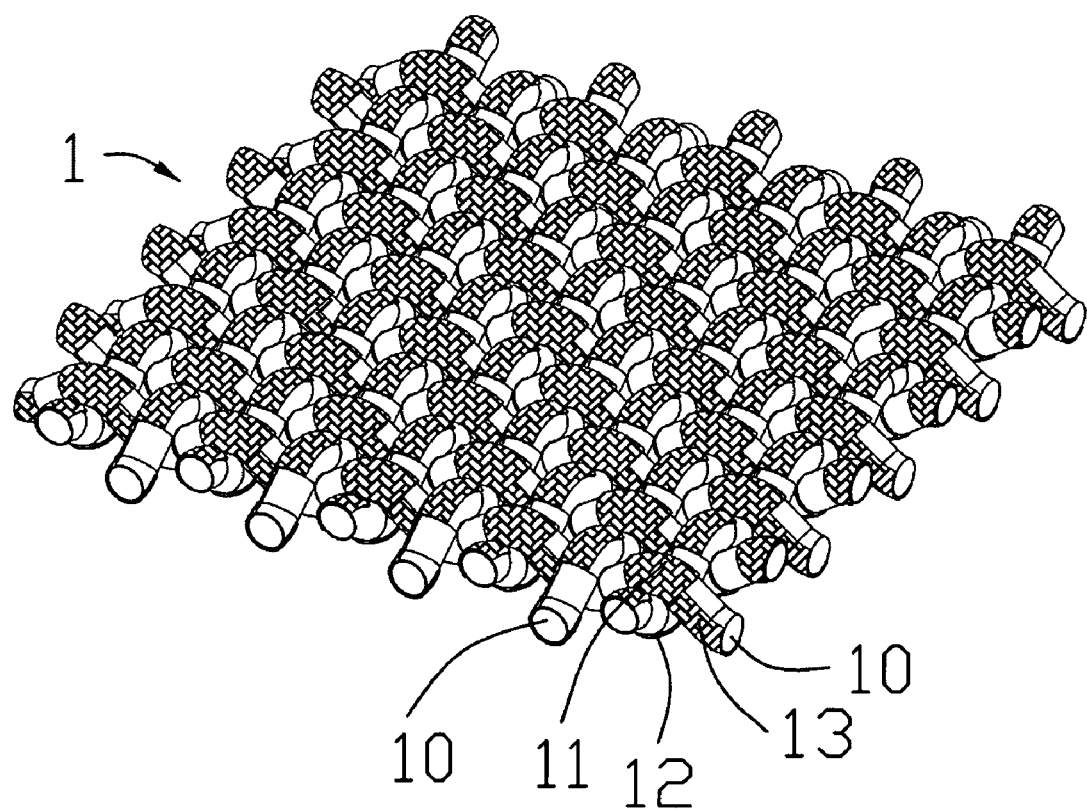
FIG. 1 is an isometric view of an electrical interposer in accordance with a preferred embodiment of the present invention.
Figure 3:
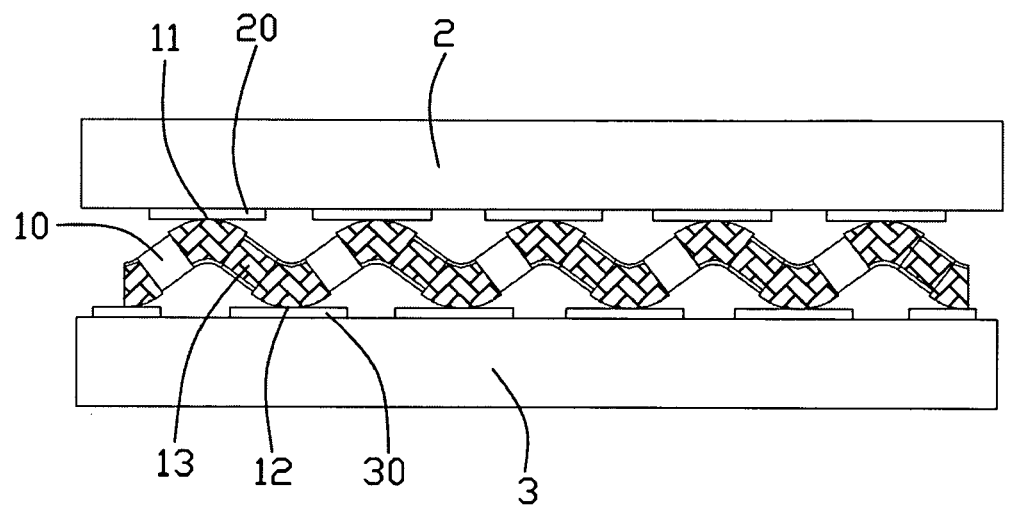
FIG. 3 is a side view showing the core of the interposer connected with two electrical devices in accordance with the preferred embodiment.

FIG. 1 illustrates an electrical interposer 1 made in accordance to a first preferred embodiment of the present invention. Referring to FIG. 3, the electrical interposer 1 is used to connect two electronic devices (an IC package 2 and a printed circuit board 3 in present invention), both in a manner of LGA (Land Grid array).

Figure 2:
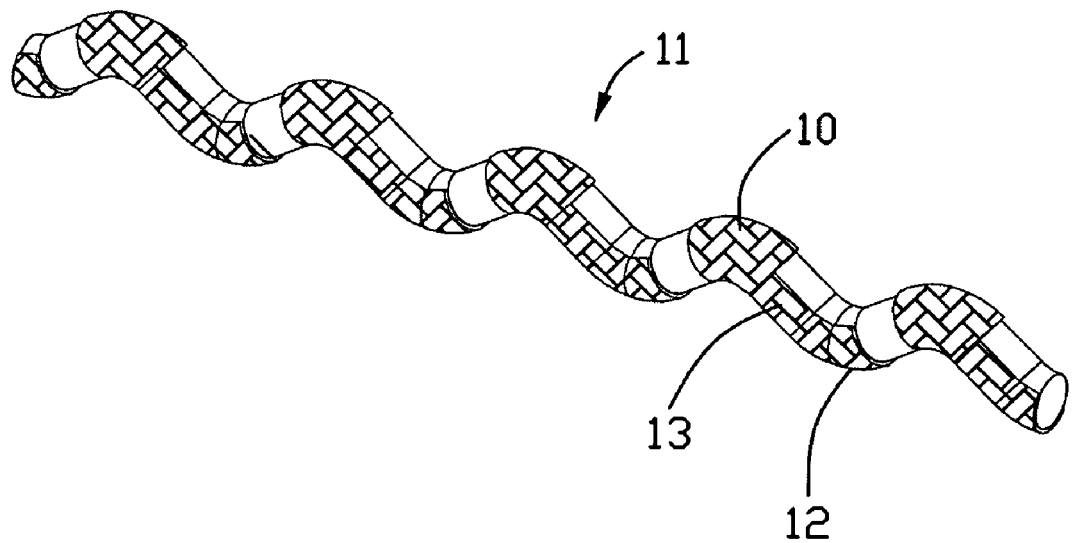
FIG. 2 is an isometric view of one core of the electrical interposer in accordance with the preferred embodiment of the present invention.

The electrical interposer 1 is configured with two groups of elastomeric cores 10 having identical configuration while respectively extending in two directions intersecting with each other. Those two groups of cores 10 interlace with each other to configure a woven structure. FIG. 2 discloses a single core 10 which has an undulating shape and includes a plurality of peaks 11 and valleys 12 alternately arranged. Each peak 11 is electrically connected with a corresponding neighboring valley 12 by a conductive layer 13 plated on the outer surface of the core 10. The conductive layer 13 is made of Cu and is firstly plated over the whole surface of the cores 10 and then selectively removing certain area where insulation is desired by etching process so that one peak 11 is electrically connected with only one neighboring valley 12 while insulative from others. After etching process, each discrete conductive layer 13 substantially covers a top surface of the peak 11, a bottom surface of the neighboring valley 12 and partial surface between the neighboring peak 11 and valley 12. After the woven structure is finished, the peaks 11 of the cores 10 jointly constitute an upper interface for contacting with one of the IC package 2 and the printed circuit board 3 in the manner similar to the interconnection of LGA, and the valleys 12 of the cores 10 jointly constitute a lower interface for contacting with the other one also in a manner of LGA. The IC package 2 and the printed circuit board 3 are respectively featured with electric pads 20, 30 exposed thereon for contacting with the peaks 11 or the valleys 12 of the cores 10, respectively.

Figure 4:
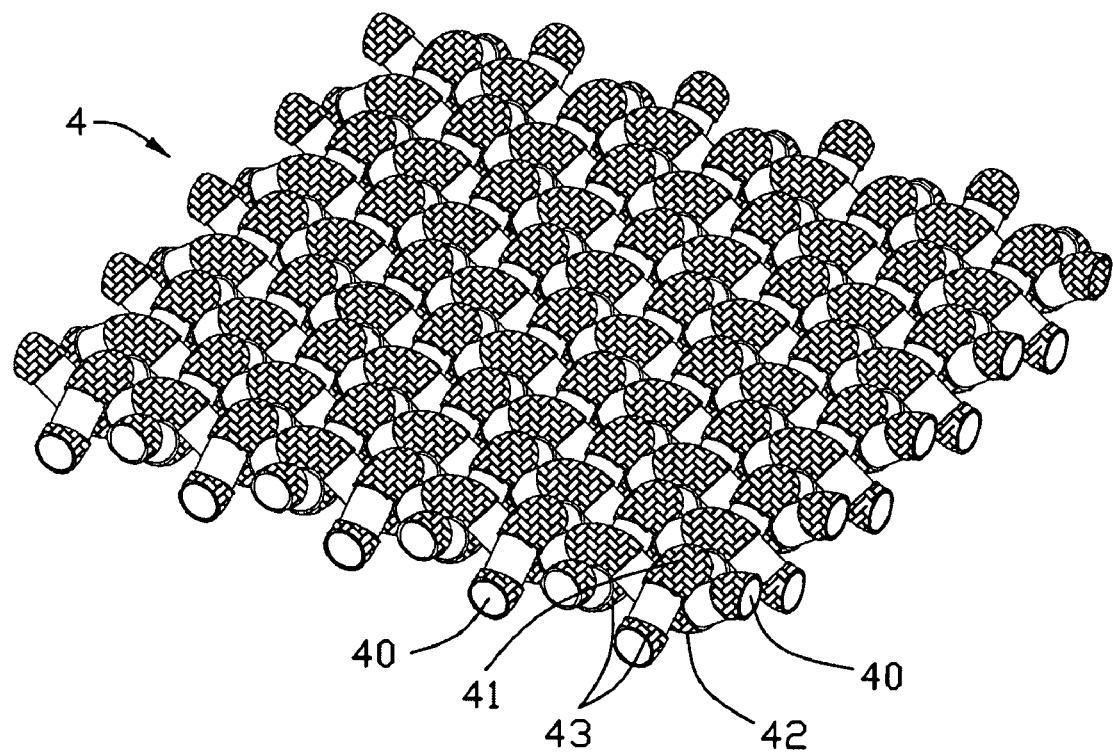
FIG. 4 is an isometric view of an electrical interposer in accordance with a second preferred embodiment of the present invention.
Figure 5:
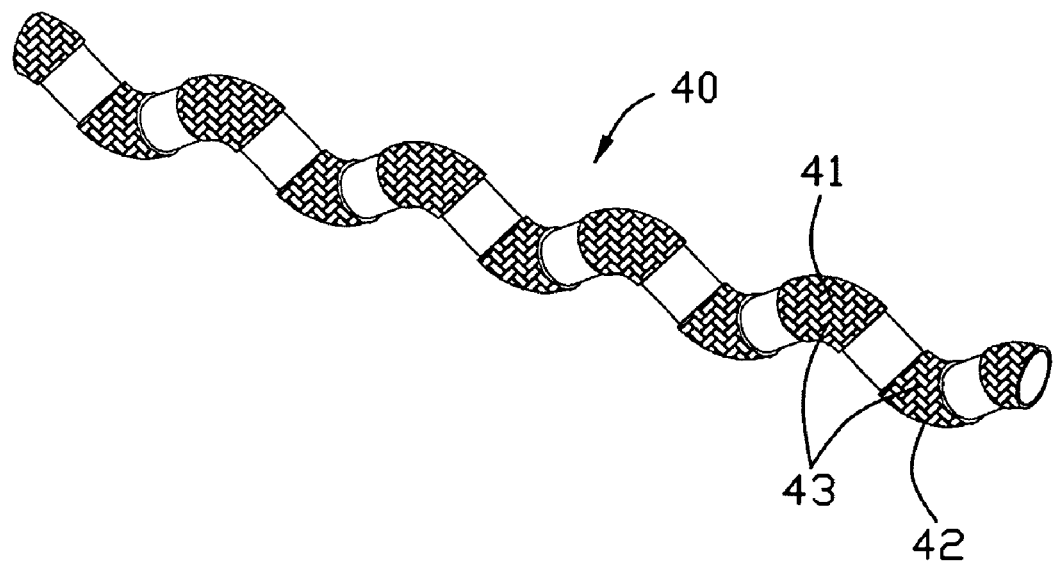
FIG. 5 an isometric view of one core of the electrical interposer in accordance with the second preferred embodiment of the present invention.
Figure 6:
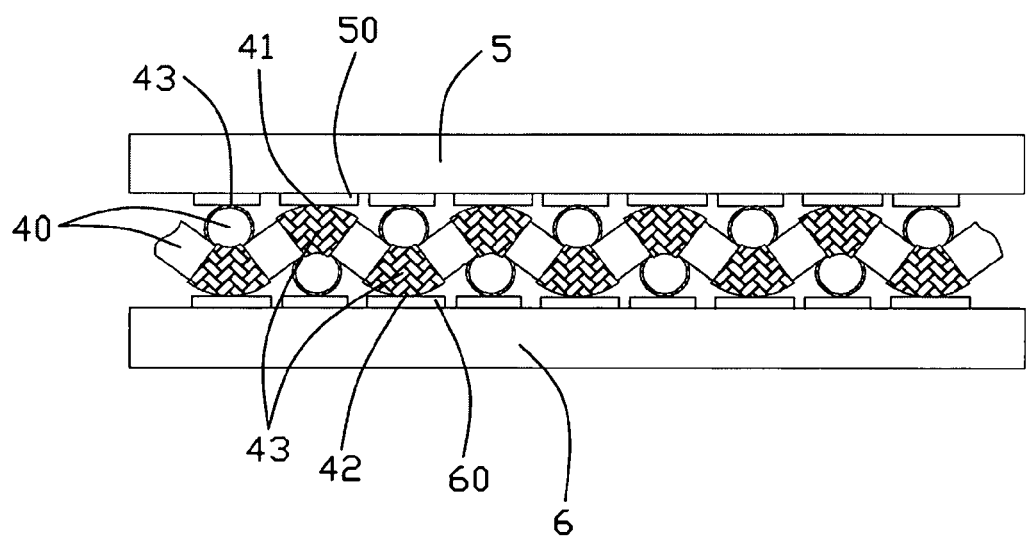
FIG. 6 is a sectional view showing the interposer connected with two electrical devices in accordance with the second preferred embodiment.

FIGS. 4-6 illustrates another electrical interposer 4 made in accordance to a second preferred embodiment of the present invention, for being used to connecting an IC package 5 and a printed circuit board 6, both in a manner of LGA.

The electrical interposer 4 is configured with two groups of elastomeric cores 40 having identical configuration while respectively extending in two directions perpendicular to each other. The two groups of cores 40 interlace with each other to configure a woven structure. FIG. 5 shows a single core 40 which has an undulating shape and includes a plurality of peaks 41 and valleys 42 alternately arranged. Each peak 41 and valley 42 is covered by an individual conductive layer 43 plated over the outer surface of the core 40. Neighboring peak 41 and valley 42 are electrically isolated from each other. The conductive layer 43 is made of Cu and is firstly plated on the whole surface of the cores 40 and then the conductive layer at the middle position between the neighboring peak 41 and the valley 42 is removed by etching process so that one peak 41 is insulated from a neighboring valley 42. After the woven structure is finished, a peak 41 of a transverse core 40 and a corresponding valley 42 of a longitudinal core 40 stack with other in a vertical direction and electrically connected with each other by the conductive layers 43 thereon contacting with other. All of the peaks 41 of the cores 40 jointly constitute an upper interface for contacting with the IC package 5 in the manner of LGA, and the valleys 42 of the cores 40 jointly constitute a lower interface for contacting with the printed circuit board 5, else in the manner of LGA. The IC package 5 and the printed circuit board 6 are respectively featured with electric pads 50, 60 exposed thereon for contacting with the peaks 41 and the valleys 42 of the cores 40, respectively.

Alternatively, another embodiment should be possible according to the present invention. In this alternative embodiment, the plated layers are replaced by a plurality of rigid conductive sheets (not shown) covering on the outer surface of the core to constitute electrical connection paths.

Due to its simple structure and making process, the electrical interposer 1 thereby has a relative lower profile and has a lower cost. In addition, a mass of electrical interposers 1 could be produced at one time by cutting a large such woven structure, and therefore high efficiency of production is reached.

While preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical interposer for connecting two electronic devices, comprising:
   a plurality of first insulating cores with undulating structure extending in a first direction, each first core having first peaks and first valleys alternately arranged in the first direction, each of the first peaks being electrically connected with a corresponding neighboring first valley through conductive member on the outer surface of the first insulating cores but said first peaks being insulated from each other; and
   a plurality of second insulating cores with undulating structure extending in a second direction angular with the first direction, each second core having second peaks and second valleys alternately arranged in the second direction; each of the second peaks being electrically connected with a corresponding neighboring second valley through conductive member on the outer surface of the second insulating cores but said second peaks being insulated from each other;
   wherein the first cores and the second cores interlace with each other to reach a woven structure with the first peaks and the second peaks jointly constituting an upper interface, and the first valleys and the second valleys jointly constituting a lower interface.

2. The electrical interposer as claimed in claim 1, wherein the first cores and the second cores are perpendicular to each other.

3. The electrical interposer as claimed in claim 1, wherein the first or the second peak is electrically connected with neighboring valley by a conductive layer plated on the outer surface of the first or second core.

4. The electrical interposer as claimed in claim 1, wherein the first and second cores are made of elastomeric material.

5. The electrical interposer as claimed in claim 1, wherein the first and second cores have substantially identical configuration.

6. The electrical interposer as claimed in claim 1, wherein the upper interface and the lower interface are connected with the electronic devices respectively in a manner of LGA (Land Grid Array).

7. An electrical interposer, comprising:
   a plurality of first insulative wires extending from a first direction;
   a plurality of second insulative wires extending from a second direction orthogonal to the first direction and interlaced with the first insulative wires creating a plurality of first peak and valley along the first direction and a plurality of second peak and valley along the second direction;
   wherein an outer surface of the first peak of the first wire and an outer surface of the second valley of the second wire are electrically connected with each other to be configured as a first contact, and an outer surface of the first valley of the first wire and an outer surface of the second peak of the second wire are electrically connected with each other to be configured as a second contact.

8. The electrical interposer as claimed in claim 7, wherein the first peak and valley and the second peak and valley are each plated with a conductive layer while neighboring peak and valley in same wire are isolated from each other.

9. The electrical interposer as claimed in claim 1, wherein the first peak is higher than the first valley and an electrical path is established on the outer surface of each of the cores between said first peak and said first valley.

10. The electrical interposer as claimed in claim 9, wherein the second peak is higher than the second valley and an electrical path is established on the outer surface of each of the cores between said first peak and said first valley.

11. The electrical interposer as claimed in claim 7, wherein the out surface of the first peak of the first wire and the out surface of the second valley of the second wire are electrically connected with each other, and the first valley of the first wire and the second peak of the second wire are electrically connected with each other.

12. The electrical interposer as claimed in claim 7, wherein the first peak, the first valley, the first peak and the second peak are coated with a conductive layer on the outer surface of the first or second core.

* * * * *